US012429597B2

(12) United States Patent
Neil et al.

(10) Patent No.: US 12,429,597 B2
(45) Date of Patent: *Sep. 30, 2025

(54) LIGHT SOURCE SYSTEM

(71) Applicant: Analog Devices International Unlimited Company, Limerick (IE)

(72) Inventors: David Neil, Edinburgh (GB); Jonathan Ephraim David Hurwitz, Edinburgh (GB); George Redfield Spalding, Jr., Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 124 days.

This patent is subject to a terminal disclaimer.

(21) Appl. No.: 18/156,804

(22) Filed: Jan. 19, 2023

(65) Prior Publication Data
US 2023/0152463 A1 May 18, 2023

Related U.S. Application Data

(63) Continuation of application No. 16/780,735, filed on Feb. 3, 2020, now Pat. No. 11,604,283.

(51) Int. Cl.
*G01C 3/08* (2006.01)
*G01S 7/484* (2006.01)
(Continued)

(52) U.S. Cl.
CPC .......... *G01S 17/894* (2020.01); *G01S 7/484* (2013.01); *H01S 5/062* (2013.01); *H01S 5/183* (2013.01); *H02J 7/345* (2013.01)

(58) Field of Classification Search
CPC ........ G01S 17/894; G01S 7/484; H01S 5/062; H01S 5/183; H02J 7/345
See application file for complete search history.

(56) References Cited

U.S. PATENT DOCUMENTS 5,141,308 A 8/1992 Danckwerth et al.
5,291,505 A 3/1994 Nielsen
(Continued)

FOREIGN PATENT DOCUMENTS

CN 102177687 A 9/2011
CN 103959086 A 7/2014
(Continued)

OTHER PUBLICATIONS

"U.S. Appl. No. 16/780,735, Preliminary Amendment Filed Feb. 2, 2021", 8 pgs.
(Continued)

*Primary Examiner* — Mark Hellner
(74) *Attorney, Agent, or Firm* — Schwegman Lundberg & Woessner, P.A.

(57) ABSTRACT

The present disclosure relates to a light source system suitable for use in a time of flight camera. The light source system includes a light source, such as a laser, and a driver arranged to supply a drive current to the light source to turn the light source on to emit light. The driver includes a capacitor to store energy and then discharge to generate the drive current, and the driver is integrated into a semiconductor die on which the light source is mounted. Consequently, the driver includes within it the source of energy for the drive current and the light source and driver are very close together, meaning that the light source may be turned on and off very quickly with a relatively large drive current, in order to output a high optical power, short duration light pulse.

21 Claims, 7 Drawing Sheets

(51) Int. Cl.
  *G01S 17/894* (2020.01)
  *H01S 5/062* (2006.01)
  *H01S 5/183* (2006.01)
  *H02J 7/34* (2006.01)

(56) References Cited

U.S. PATENT DOCUMENTS

| | | | |
|---|---|---|---|
| 5,742,379 | A | 4/1998 | Reifer |
| 6,256,329 | B1 | 7/2001 | Ishizuka et al. |
| 6,310,682 | B1 | 10/2001 | Gavish et al. |
| 6,414,974 | B1 | 7/2002 | Russell et al. |
| 8,184,670 | B2 | 5/2012 | Crawford et al. |
| 9,054,485 | B1 | 6/2015 | Ng |
| 9,368,936 | B1 * | 6/2016 | Lenius ............ G01S 7/484 |
| 9,603,210 | B1 | 3/2017 | Carlen |
| 9,711,934 | B2 | 7/2017 | Nakabayashi et al. |
| 10,048,358 | B2 | 8/2018 | Berger et al. |
| 10,256,605 | B2 | 4/2019 | Gassend et al. |
| 10,270,527 | B1 | 4/2019 | Mentovich et al. |
| 11,444,432 | B2 | 9/2022 | Hurwitz et al. |
| 11,600,966 | B2 | 3/2023 | Hurwitz et al. |
| 11,604,283 | B2 * | 3/2023 | Neil ............ H02J 7/345 |
| 12,212,118 | B2 | 1/2025 | Neil et al. |
| 2006/0291512 | A1 | 12/2006 | Borschowa |
| 2008/0013646 | A1 | 1/2008 | Hamada et al. |
| 2009/0180500 | A1 | 7/2009 | Babushkin et al. |
| 2009/0245302 | A1 | 10/2009 | Baird et al. |
| 2011/0298156 | A1 | 12/2011 | Hooper et al. |
| 2012/0306390 | A1 | 12/2012 | Li et al. |
| 2014/0204396 | A1 | 7/2014 | Giger et al. |
| 2016/0341664 | A1 | 11/2016 | Rothberg et al. |
| 2016/0358544 | A1 | 12/2016 | Fu |
| 2017/0070029 | A1 | 3/2017 | Moeneclaey et al. |
| 2017/0104416 | A1 | 4/2017 | Kataoka et al. |
| 2017/0256538 | A1 | 9/2017 | Lu et al. |
| 2018/0145482 | A1 | 5/2018 | Lee et al. |
| 2018/0180978 | A1 | 6/2018 | Yamada et al. |
| 2018/0278011 | A1 * | 9/2018 | Galvano ............ G01S 7/4813 |
| 2018/0284242 | A1 | 10/2018 | Campbell |
| 2018/0299536 | A1 | 10/2018 | Marron et al. |
| 2018/0301872 | A1 | 10/2018 | Burroughs et al. |
| 2019/0267911 | A1 | 8/2019 | Lawson |
| 2019/0317197 | A1 | 10/2019 | Wrede et al. |
| 2019/0386460 | A1 | 12/2019 | Barnes et al. |
| 2020/0251991 | A1 * | 8/2020 | Nate ............ H02M 3/156 |
| 2021/0239838 | A1 | 8/2021 | Neil et al. |
| 2021/0242660 | A1 | 8/2021 | Hurwitz et al. |
| 2021/0242661 | A1 | 8/2021 | Hurwitz et al. |
| 2021/0273405 | A1 | 9/2021 | Neil et al. |
| 2023/0178961 | A1 | 6/2023 | Hurwitz et al. |

FOREIGN PATENT DOCUMENTS

| | | | |
|---|---|---|---|
| CN | 108141946 | | 6/2018 |
| CN | 110401103 A | * | 11/2019 ........... H01S 5/0428 |
| CN | 113206442 | | 8/2021 |
| CN | 113206589 | | 8/2021 |
| CN | 113207207 | | 8/2021 |
| DE | 102018120251 | | 3/2019 |
| GB | 1563944 | | 4/1980 |
| JP | 2007180452 | | 7/2007 |
| JP | 5509537 | | 4/2014 |
| JP | 2015065474 | | 4/2015 |
| JP | 2017003785 | | 1/2017 |
| WO | 2017003681 | | 1/2017 |
| WO | 2018125825 | | 7/2018 |
| WO | 2019167039 | | 9/2019 |

OTHER PUBLICATIONS

"Chinese Application Serial No. 202110148602.1, Notification to Make Rectification mailed Mar. 26, 2021", 2 pgs.
"Chinese Application Serial No. 202110148602.1, Response filed May 21, 2021 to Notification to Make Rectification mailed Mar. 26, 2021", 19 pgs.
"European Application Serial No. 21152618.1, Extended European Search Report mailed Jun. 18, 2021", 10 pgs.
"European Application Serial No. 21152620.7, Extended European Search Report mailed Jun. 22, 2021", 13 pgs.
"European Application Serial No. 21152619.9, Extended European Search Report mailed Jun. 23, 2021", 9 pgs.
"U.S. Appl. No. 16/780,761, Non Final Office Action mailed Dec. 15, 2021", 11 pgs.
"U.S. Appl. No. 16/780,761, Response filed Mar. 15, 2022 to Non Final Office Action mailed Dec. 15, 2021", 9 pgs.
"U.S. Appl. No. 16/780,761, Notice of Allowance mailed May 3, 2022", 7 pgs.
"U.S. Appl. No. 17/080,629, Non Final Office Action mailed Jul. 25, 2022", 11 pgs.
"U.S. Appl. No. 16/780,735, Non Final Office Action mailed Jul. 28, 2022", 11 pgs.
"U.S. Appl. No. 17/080,629, Response filed Oct. 24, 2022 to Non Final Office Action mailed Jul. 25, 2022", 9 pgs.
"U.S. Appl. No. 16/780,735, Response filed Oct. 27, 22 to Non Final Office Action mailed Jul. 28, 2022", 9 pgs.
"U.S. Appl. No. 17/080,629, Notice of Allowance mailed Nov. 2, 2022", 8 pgs.
"U.S. Appl. No. 16/780,735, Notice of Allowance mailed Nov. 9, 2022", 6 pgs.
"U.S. Appl. No. 16/780,735, Corrected Notice of Allowability mailed Dec. 7, 2022", 3 pgs.
"European Application Serial No. 21152618.1, Communication Pursuant to Article 94(3) EPC mailed Jan. 25, 2023", 4 pgs.
Hallman, Lauri, "A High-Speed Power Laser Transmitter for Single Photon Imaging Applications", IEEE Sensors, (2014), 1157-1160.
Hallman, Lauri, "On Two-Dimensional Rangefinding Using ~1 nJ ~100 ps Laser Diode Transmitter and a CMOS SPAD Matrix", IEEE Photonics Journal, 10(4), (Aug. 2018), 13 pgs.
Kostamovaara, Juha, "On Laser Ranging Based on High-Speed Energy Laser Diode Pulses and Single-Photon Detection Techniques", IEEE Photonics Journal, 7(2), (Apr. 2015), 16 pgs.
Zbik, Mateusz, "Charge-Line Dual-FET High-Repetition-Rate Pulsed Laser Driver", Applied Sciences, 9(7), 1289, (2019), 12 pgs.
"Chinese Application Serial No. 202110148602.1, Office Action mailed Jan. 30, 2024", w/ English translation, 15 pgs.
"Chinese Application Serial No. 202110148948.1, Office Action mailed Feb. 27, 2024", w/ English Translation, 13 pgs.
"U.S. Appl. No. 17/165,477, Non Final Office Action mailed Apr. 3, 2024", 15 pgs.
"Chinese Application Serial No. 202110147830.7, Office Action mailed Sep. 27, 2023", 15 pgs.
U.S. Appl. No. 16/780,761 U.S. Pat. No. 11,444,432, filed Feb. 3, 2020, Laser Driver Pulse Shaping Control.
U.S. Appl. No. 16/780,735 U.S. Pat. No. 11,604,283, filed Feb. 3, 2020, Light Source System.
U.S. Appl. No. 17/080,629 U.S. Pat. No. 11,600,966, filed Oct. 26, 2020, Light Source System.
U.S. Appl. No. 18/155,019, filed Jan. 16, 2023, Light Source System.
U.S. Appl. No. 17/165,477, filed Feb. 2, 2021, Light Source System.
"U.S. Appl. No. 17/165,477, Response filed Aug. 2, 2024 to Non Final Office Action mailed Apr. 3, 2024", 12 pgs.
"U.S. Appl. No. 17/165,477, Notice of Allowance mailed Sep. 30, 2024", 7 pgs.

* cited by examiner

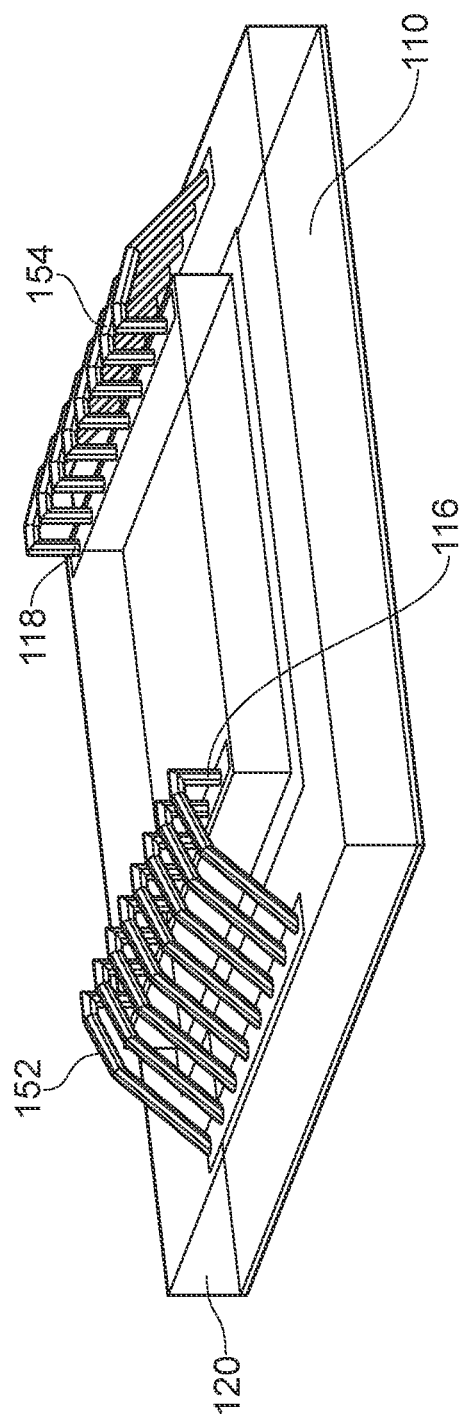
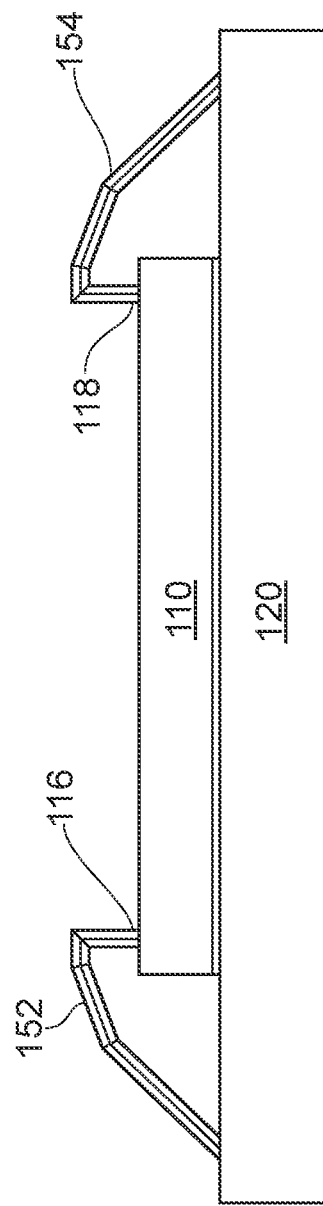
FIG. 2A
FIG. 2B

LIGHT SOURCE SYSTEM

CLAIM OF PRIORITY

This application is a continuation of U.S. patent application Ser. No. 16/780,735, filed Feb. 3, 2020, which is hereby incorporated by reference herein in its entirety.

TECHNICAL FIELD

The present disclosure relates to a light source system, which may be used, for example, as the light source in a time-of-flight camera system.

BACKGROUND

Time-of-flight (ToF) camera systems are range imaging systems that resolve the distance between the camera and an object by measuring the round trip time of a light signal emitted from the ToF camera system. The systems typically comprise a light source (such as a laser or LED), a light source driver to control the emission of light from the light source, an image sensor to image light reflected by the subject, an image sensor driver to control the operation of the image sensor, optics to shape the light emitted from the light source and to focus light reflected by the object onto the image sensor, and a computation unit configured to determine the distance to the object by determining the amount of time between an emission of light from the light source and a corresponding reflection from the object.

ToF camera systems may measure distances ranging from a few centimetres to 100s or 1000s of metres. Given the high speed of light, a time difference of only 16.66 ns between an emission of light and reception of reflected light corresponds to an object 2.5 m from the camera system. Therefore, ToF camera systems require high levels of temporal precision and control in order to measure distances accurately.

SUMMARY

The present disclosure relates to a light source system suitable for use in a time of flight camera. The light source system includes a light source, such as a laser, and a driver arranged to supply a drive current to the light source to turn the light source on to emit light. The driver includes a capacitor to store energy and then discharge to generate the drive current, and the driver is integrated into a semiconductor die on which the light source is mounted. Consequently, the driver includes within it the source of energy for the drive current and the light source and driver are very close together, meaning that the light source may be turned on and off very quickly with a relatively large drive current, in order to output a high optical power, short duration light pulse.

In a first aspect of the present disclosure, there is provided a light source system comprising: a light source; and a semiconductor die comprising an integrated first driver, wherein the light source is mounted on the semiconductor die and the first driver is coupled to the light source and configured to control supply of a first drive current to the light source for controlling operation of the light source, wherein the first driver comprises a first capacitor for storing electrical energy for use in generating the first drive current.

The first driver may be configured to operate in: a charging state, during which the first capacitor stores charge received from a power supply; and an emission state, during which the first capacitor discharges to generate the first drive current, which is supplied to the light source to turn the light source on.

The first capacitor may be set to any suitable size (i.e., capacitance), depending on the size of first drive current required and/or the duration of first drive current required and/or the duty cycle ratio between charging state and emission state.

The first driver may further comprise a first switch configured to: during the emission state, close a first drive current circuit comprising the first capacitor and the light source to carry the first drive current between the light source and the first driver; and during the charging state, open the first drive current circuit during the charging state to stop the supply of first drive current to the light source.

The first switch may be coupled between a cathode terminal of the light source and a reference voltage of the first driver, and wherein the first capacitor is coupled between an anode terminal of the light source and the reference voltage of the first driver.

The light source system may further comprise a controller configured to control the first switch, so as to control switching of the first driver between the charging state and the emission state.

The first switch may comprise a first transistor, wherein the controller is configured to control operation of the first switch by controlling a first transistor driver signal at a gate/base terminal of the first transistor.

The light source system may further comprise a turn-on pre-driver, wherein the controller is configured to turn on the first transistor by applying a turn-on signal to the gate/base terminal of the first transistor using the turn-on pre-driver in order to transition the first driver from the charging state to the emission state.

The light source system may further comprise a voltage regulator coupled to the first capacitor and the turn-on pre-driver, wherein the voltage regulator is configured to: receive energy from the first capacitor; and supply a regulated voltage to the turn-on pre-driver at least during transition of the first driver from the charging state to the emission state.

The light source system may further comprise a turn-off pre-driver, wherein the controller is configured to turn off the first transistor by apply a turn-off signal to the gate/base terminal of the first transistor using the turn-off pre-driver in order to transition the first driver from the emission state to the charging state.

To transition the first driver from the emission state to the charging state, the controller may be configured to apply both the turn-on signal and the turn-off signal to the gate/base terminal of the first transistor for a first period of time, and then apply only the turn-off signal to the gate/base terminal of the first transistor for a second period of time.

The light source system may further comprise a photodetector arranged to detect light emitted from the light source, wherein the light source system is further configured to charge the first capacitor only if the photodetector detects light emitted from the light source during the preceding emission state.

The light source may comprise a laser, for example a vertical-cavity surface-emitting laser.

The light source may comprise at least one terminal of a first polarity on a first surface of the light source and at least one terminal of a second polarity on a second surface of the light source, wherein the first driver is coupled to the at least one terminal of the first polarity and the at least one terminal of the second polarity such that the first drive current can flow through the light source to turn on the light source.

The second surface of the light source may be affixed to a first surface of the semiconductor die, and wherein the first driver is coupled to the at least one terminal of the first plurality by a first plurality of bonding wires.

The light source may comprise a first terminal of a first polarity, a second terminal of the first polarity and at least one third terminal of a second polarity, and wherein the first driver is coupled to the first terminal and the third terminal such that the first drive current can flow between the first terminal and the third terminal to turn on the light source, and wherein the semiconductor die further comprises an integrated second driver coupled to the second terminal and the third terminal, wherein the second driver is configured to control supply of a second drive current to the light source such that the second drive current can flow between the second terminal and the third terminal to turn on the light source, wherein the second driver comprises a second capacitor for storing electrical energy for use in generating the second drive current.

The first terminal and the second terminal may be are arranged on the light source such that they are substantially symmetrical about a plane of symmetry, wherein the first driver and the second driver are arranged within the die such that they are substantially symmetrical about the plane of symmetry.

In a second aspect of the present disclosure, there is provided a time of flight camera system comprising: a light source system comprising: a light source for emitting light towards an object to be imaged; and a semiconductor die comprising an integrated first driver, wherein the light source is mounted on the semiconductor die and the first driver is coupled to the light source and configured to control supply of a first drive current to the light source for controlling operation of the light source, wherein the first driver comprises a first capacitor for storing electrical energy for use in generating the first drive current; and a photodetector for receiving light reflected from the object to the imaged.

In a third aspect of the present disclosure, there is provided a driver for coupling to a light source to drive the light source, the driver comprising: at least one capacitor for storing charge; a controllable switch for switching the driver between a charging state and an emission state; a turn-on pre-driver coupled to the controllable switch, wherein the turn-on pre-driver is configured for use in controlling the controllable switch when transitioning from the charging state to the emission state; and a voltage regulator coupled to the at least one capacitor and the turn-on pre-driver and configured to supply a regulated voltage to the turn-on pre-driver, wherein the driver is configured such that during the charging state the at least one capacitor stores charge and during the emission state the at least one capacitor dischargers to supply a drive current to the light source to turn the light source on.

The driver may be configured for coupling to a power supply such that during the charging state, the at least one capacitor stores charge received from the power supply.

DRAWINGS

Aspects of the present disclosure are described, by way of example only, with reference to the following drawings, in which:

FIG. 2A shows a view of the arrangement of the VCSEL 110 mounted on the semiconductor die 120 of the light source system of FIG. 1;

FIG. 2B shows a further view of the arrangement of the VCSEL 110 mounted on the semiconductor die 120 of the light source system of FIG. 1;

DETAILED DESCRIPTION

Figure 1:
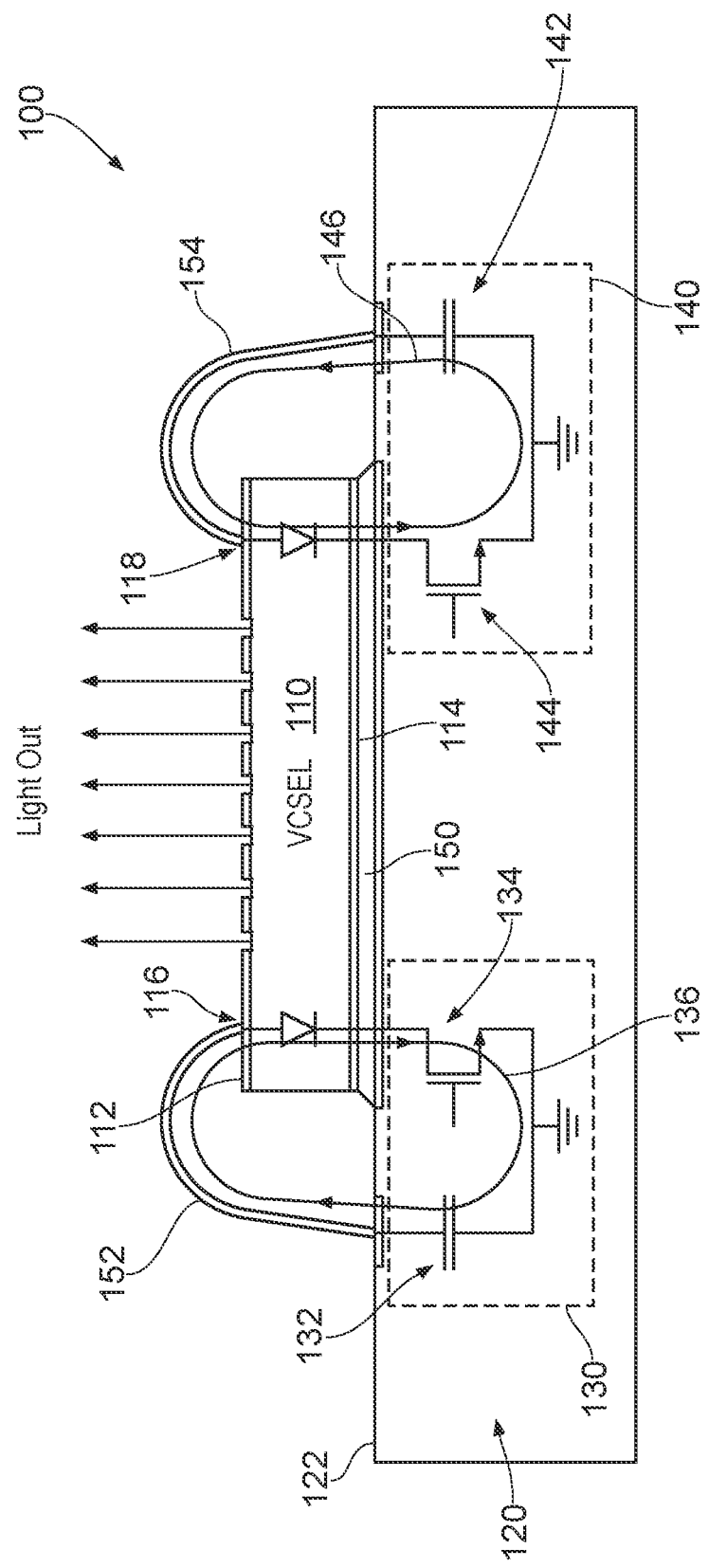
FIG. 1 shows an example representation of a light source system, in accordance with an aspect of the present disclosure.

Many factors may affect the precision with which a ToF camera system can measure distance to an object. One of those factors is the nature of the light emitted from the light source. The accuracy with which the system knows the moment of light emission may affect how accurately the system can determine distance to the object. For example, if the time difference between the moment the system believes it emitted light and the moment at which the reflected light was received is 20 ns, an object distance of about 3 m will be determined. However, if the emission of light actually took place about 0.4 ns after the system thought it took place, the true time difference between light emission and light reflection is in fact about 19.6 ns, which equates to an object distance of 2.94 m. For many safety critical applications, an error of this size may be significant.

The inventors have realised that if the light source is controlled to emit a very short pulse of light (in the order of 100 ps or less), the precision of the ToF camera system may be improved. A relatively long light emission pulse may render it unclear whether reflected light corresponds to photons emitted at the very start, middle or very end of the light emission pulse. To address this, more samples may be gathered to help de-convolve the shape of the laser, but this slows down the system and consumes more power. However, if the light emission pulse is very short, such as less than 100 ps, this represents a maximum uncertainty of 0.1 ns, which may be acceptable for most applications. Consequently, the time between emission of light and corresponding reflection of light may be measured with more certainty.

To achieve very fast turn on of the light source, the inventors have determined that a high current light source driving signal may be beneficial. Driving the light source with a relatively high, short duration current pulse should shorten the duration of the output light pulse, and increase the peak optical power output. The inventors have realised that this higher peak optical power may bring a further benefit in improving the precision of the ToF camera system. In particular, a number of safety regulations limit the average optical power emitted from ToF camera systems with no limit on the peak optical power output. By reducing the light emission duration, a system may emit higher optical power whilst staying within safety regulations. Emitting light with higher peak optical power may be beneficial for improving the range and precision of the ToF camera system.

However, there are many challenges in driving a light source to emit a very short, high optical power light pulse. A very short, high current driving signal may be required for driving the light source, which may put considerable demands on the power supply/source providing the driving current and may affect other electrical components that are also using that power supply. For example, if the ToF camera system is integrated in a mobile phone, drawing a relatively high current for a very short period of time, without affecting any other components or functionality of the mobile phone, may require a very high quality, costly power system within the mobile phone. Furthermore, if the ToF camera system operates with relatively high current pulses, if a system fault/failure develops, the relatively high currents may present a safety risk to the ToF camera system and/or nearby devices/components and/or operators of the ToF camera system.

In addition to this, to achieve such short light emission pulses, the laser source should be turned on and off rapidly and with precision. Inherent resistances and inductances in the light source driver circuits not only contribute to electrical losses (thereby increasing the amount of current needed to achieve a particular optical power output from the light source), but also slows circuit transitions between current levels, thereby slowing turn on and turn off.

With all of these challenges in mind, the inventors have devised a light source system that is suitable for use in ToF camera systems. In the light source system, the light source driver is integrated into a semiconductor die and includes a capacitor as the energy source for generating the current to drive the light source. The driver is designed such that the capacitor may be gradually charged using a relatively low current power supply/source, and then rapidly discharged to provide most, if not all, of the energy required for the current driving the light source. Furthermore, the light source is mounted on, or stacked on, the driver such that the physical distance between the driver and the light source is minimised. By minimising the distance between the driver and the light source, the physical length of the current path between the driver and the light source may be reduced, thereby reducing electrical resistance and inductance. Furthermore, by using a capacitor to supply the majority, if not all, of the energy required for the driver current, the physical size of the circuit loop carrying the driver current may be reduced compared with using a separate/external power unit, which even further reduces resistance and inductance. A further benefit of using a capacitor in this way is that if a system fault/failure develops, there is only a limited amount of energy available for generating the high current, which should improve overall device safety.

FIG. 1 shows an example representation of a light source system 100, suitable for use in a ToF system, in accordance with an aspect of the present disclosure. The light source system 100 comprises a light source 110, in this example a vertical-cavity surface-emitting laser (VCSEL), and a semiconductor die 120, such as a CMOS silicon die, or a GaN die, or a GaAs die, etc. Throughout this disclose, the light source 110 shall typically be referred to as a VCSEL, although it will be appreciated that any other suitable type of light source may alternatively be used, such as other types of laser or any suitable type of LED.

The VCSEL comprises a first surface 112, from which light is emitted, and a second surface 114, which opposes the first surface 112. The first surface 112 comprises a first terminal 116 and a second terminal 118 both of a first polarity, the first polarity in this example being the anode of the VCSEL diode. The second surface 114 comprises one or more third terminals of a second polarity, the second polarity in this example being the cathode of the VCSEL diode. The VCSEL 110 is mounted on, or stacked on, the semiconductor die 120. The second surface 114 of the VCSEL 110 is mounted on a first surface 122 of the semiconductor die 120 and bonded to the first surface 122 of the semiconductor die 120 using bonding material 150 and electrical interconnects, in such a way as to form an electrical connection between the one or more third terminals of the VCSEL 110 and the first and second drivers 130 and 140. Any suitable bonding material 150 and bonding techniques may be used for this, for example an epoxy or eutectic bond.

The semiconductor die 120 comprises an integrated first driver 130 and an integrated second driver 140. The first driver 130 is configured to control supply of a first drive current 136 to the VCSEL 110 for controlling operation of the VCSEL 110 (i.e., for controlling light emission from the VCSEL 110). The second driver 140 is configured to control supply of a second drive current 146 to the VCSEL 110 for controlling operation of the VCSEL 110 (i.e., for controlling light emission from the VCSEL 110). The first driver 130 comprises a first switch 134, which in this example is a first FET, for controlling the flow of the first drive current 136, and the second driver 140 comprises a second switch 146, which in this example is a second FET, for controlling the flow of the second drive current 146. The first driver 130 is electrically coupled to the first terminal 116 of the VCSEL 110 by one or more first bond wires 152 (although alternatively any other suitable form of electrical coupling may be used, for example depending on the design of the VCSEL 110). The second driver 140 is electrically coupled to the second terminal 118 of the VCSEL 110 by one or more second bond wires 154 (although alternatively any other suitable form of electrical coupling may be used, for example depending on the design of the VCSEL 110). When a sufficiently large first drive current 136 and/or second drive current 146 flows through the VCSEL 110, the VCSEL 110 will turn on and be excited to lase and therefore emit light. When no drive current, or insufficient drive current, flows through the VCSEL 110, no light should be emitted and the VCSEL is effectively turned off. Further details of the operation of the first driver 130 and the second driver 140 shall be given later in this disclosure.

FIGS. 2A and 2B show different views of the arrangement of the VCSEL 110 mounted on the semiconductor die 120. As can be seen, in this example there are eight first bond wires 152 and eight second bond wires 154, although any number of first bond wires 152 and second bond wires 154 may be used (for example, one, two, three, etc). It may be preferable to use the largest number of first bond wires 152 and second bond wires 154 possible for a given size of first terminal 116 and second terminal 118. By doing so, resistance for the first drive current 136 and the second drive current 146 may be minimised, thereby improving the power efficiency of the light source system 110 and maximising the amount of drive current delivered to the VCSEL 110.

Figure 3:
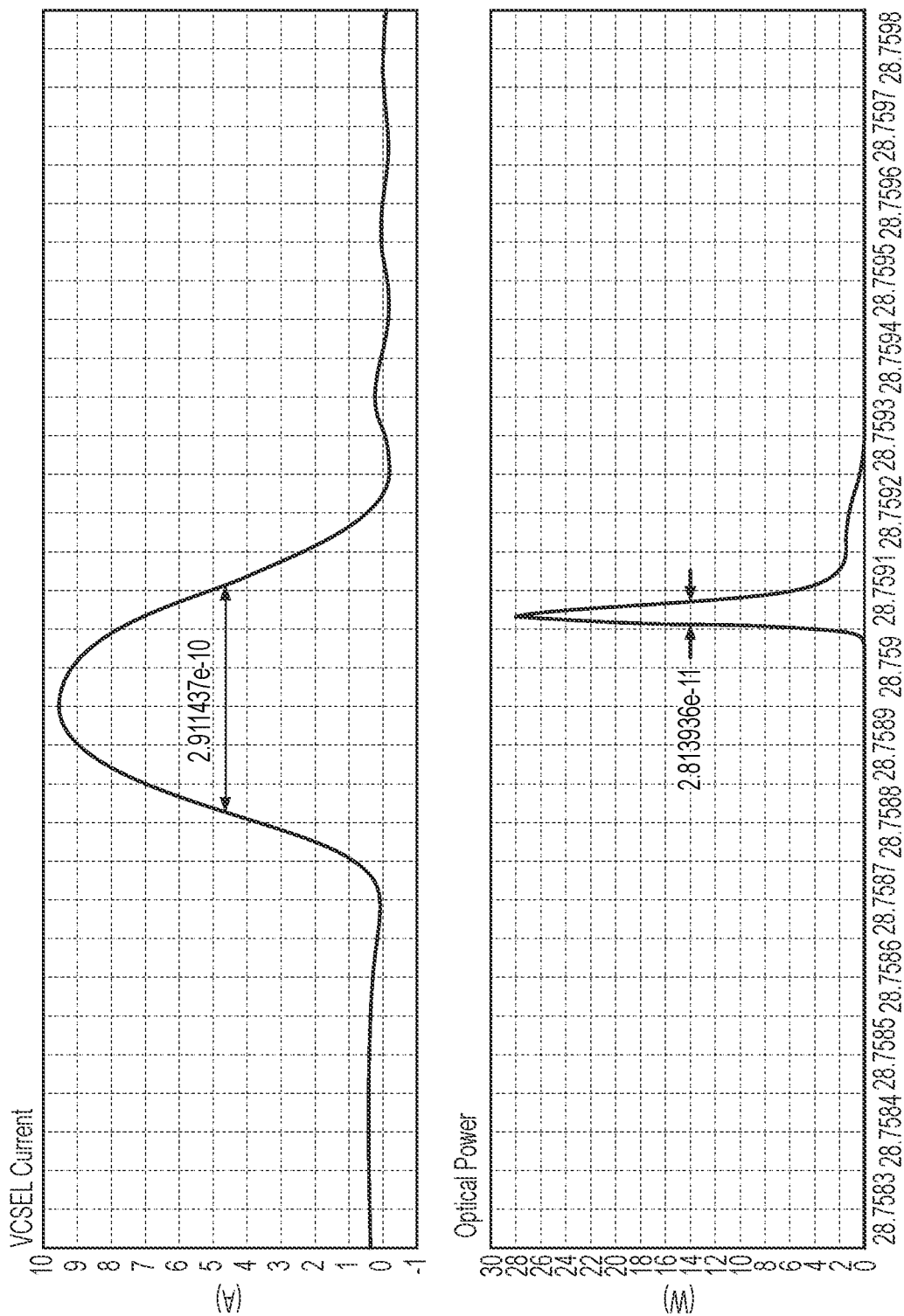
FIG. 3 shows an example graph representing a drive current for the VCSEL and optical power of light output from the VCSEL of the light source system of FIG. 1.

FIG. 3 shows graphs representing drive current (labelled VCSEL Current) and optical power of light output from the VCSEL 110. It can be seen that in this example, a drive current pulse duration of about 290 ps may be created by the drivers 130, 140, which may excite a light pulse emission from the VCSEL 110 with an effective duration of about 30 ps. It will be appreciated that the drive current pulse duration is longer than the light pulse duration largely as a consequence of lasing delays in the VCSEL 110. It will also be appreciated that this is merely one non-limiting example of drive current and light pulse duration, and that the light source system 100 may be configured to operate with different durations.

It may be counterintuitive to mount the VCSEL 110 on the integrated driver circuits 120, particularly when the drive currents are intended to be relatively high (for example, >1 A, or >3 A, or >5 A, or >8 A, or >10 A) owing to thermal dissipation difficulties. The VCSEL 110 and the drivers 130 and 140 are likely to generate significant heat when the drive currents are flowing, which should ideally be quickly and effectively dissipated in order to avoid device damage and degradation. It might have been expected that stacking the VCSEL 110 on top of the integrated drivers 130 and 140 would be likely to make heat dissipation considerably more difficult.

However, the inventors have recognised that by mounting the VCSEL 110 on the semiconductor die 120 which includes the integrated drivers 130, 140, the physical distance between the VCSEL 110 and the drivers 130, 140 may be minimised. Consequently, a first drive current circuit formed by the VCSEL 110, the first capacitor 132 and the first switch 134 to carry the first drive current 136 may be significantly smaller than other arrangements (for example, arrangements where the VCSEL 110 and the first driver 130 are mounted side-by-side on a PCB substrate with bonding wires carrying current both to and from the VCSEL 110). Likewise, the same is also true of the size of the second drive current circuit formed by the VCSEL 110, the second capacitor 142 and the second switch 144. This reduction in the size of circuits carrying the relatively high drive currents may reduce the resistance and inductance of the circuit, which may reduce circuit losses and increase the speed with which the drive currents, and therefore the VCSEL 110, can be turned on and off. This enables the drive currents to be generated as a very short duration pulse, resulting in a very short duration pulse of light from the VCSEL 110. Thus, by implementing the stacking arrangement represented in FIGS. 1, 2A, 2B, a shorter duration (for example <200 ps, or <150 ps, or <100 ps, or <80 ps, or <50 ps), higher optical power pulse of light may be output by the VCSEL 110. As explained earlier, in order to achieve this relatively short duration optical output from the VCSEL 110, a slightly longer duration drive current pulse may be required, for example to achieve a 30 ps light pulse, a 300 ps duration first drive current 136 may be required.

Not only may this improve the precision of a ToF system that uses the light source system 100, it has unexpectedly been realised that because of the short duration of current achieved by this arrangement, heat dissipation may not in fact be as significant a problem as might initially have been thought. ToF systems may operate by emitting light for a period of time and then turning off for a period of time. For example, a typical light emission duration for a SPAD direct ToF system may be a pulse duration of about 1-3 ns every 0.2 µs, representing a duty cycle ratio of about 1:100 for light emission:no light emission. A typical light emission duration of a continuous wave (CW) indirect ToF system may be about 100-200 ns every 2 ms, representing a duty cycle ratio between about 1:20 to 1:10. However, in the present disclosure, because such a short, high optical power light pulse has been achieved, a duty cycle of at least 1:1,000, such as 1:5,000, or 1:10,000, may be implemented. For example, the approximately 30 ps light pulse represented in FIG. 3 corresponds to a duty cycle ratio of about 1:30,000. Consequently, there is a relatively very long period of time during which heat is not being generated by the light source system 100, during which time the heat generated during the emission part of the cycle may gradually dissipate into the surrounding environment and into the body of the die (and any other material coupled to the die).

The VCSEL 110 in the example represented in FIGS. 1, 2A and 2B has two terminals 116 and 118 of the same polarity, arranged to be substantially symmetrical about a plane of symmetry. In this example, the plane of symmetry extends perpendicular to the first and second surfaces 112, 114 of the VCSEL 110, roughly through the middle of the first and second surfaces 112, 114, such that the first terminal 116 is on one side of the plane of symmetry and the second terminal 118 is its mirror image on the other side of the plane of symmetry. The inventors have realised that it is possible to layout within the die 120 the components of the first driver 130 and the second driver 140 in such a way that they are substantially, or approximately, symmetrical about the plane of symmetry (as represented in FIG. 1). Consequently, the direction of the path/loop of the first drive current 136 is substantially opposite to that of the second drive current 146 (for example, the path of the first drive current 136 may be clockwise and the path of the second drive current 146 may be anticlockwise). As a result of this, EM radiation generated by one of the current paths/loops may be substantially, or at least partially, cancelled by EM radiation generated by the other current path/loop, particularly at far-field. Thus, RF emissions from the light source system 100 (caused by the light source system 100 generating pulses of light at RF frequencies) may be reduced and kept acceptably low, even when the drive currents are relatively high. This means that the light source system 100 should not negatively affect other nearby electrical devices/components, or breach RF emissions legislation. It will be appreciated that whilst this symmetrical arrangement may have benefits, such an arrangement is not essential and the first driver 130 and second driver 140 may be relatively arranged in any other suitable way.

Figure 4:
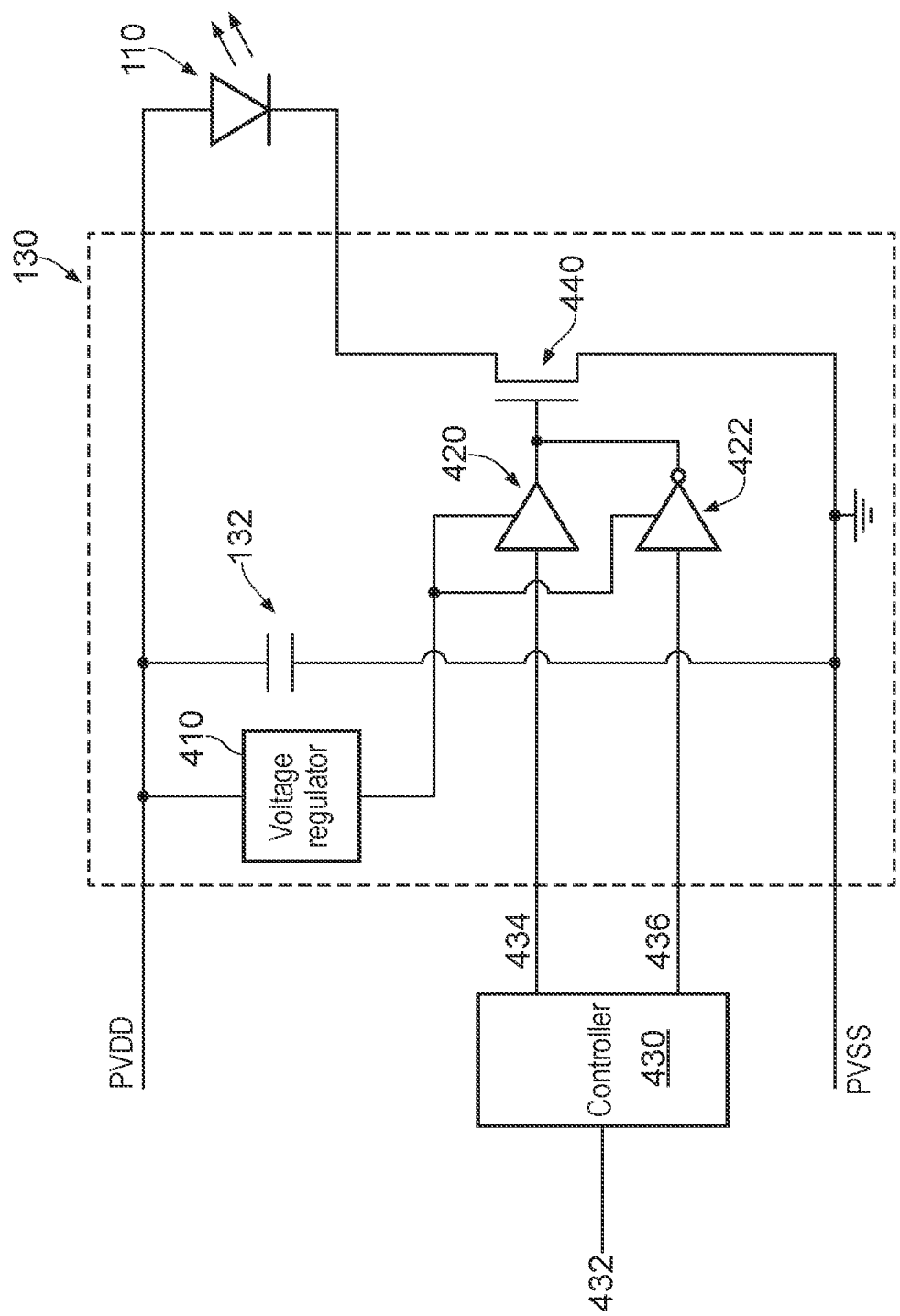
FIG. 4 shows a schematic representation of details of an example implementation of the light source system of FIG. 1.

FIG. 4 shows a schematic representation of example details of the light source system 110. The representation provides further details of an example implementation of the first driver 130, to help explain the operation of the first driver 130 in order to control supply of the first drive current 136 to the VCSEL 110. In this example, the first driver 130 further comprises a voltage regulator 410 (which may be implemented in any suitable way known to the skilled person), a turn-on pre-driver 420, a turn-off pre-driver 422 and a FET 440 which acts as the first switch 134. The light source system 430 also comprises a controller 430 configured to control switching of the first driver 130 between a charging state and an emission state. The control may be implemented in any suitable way, for example as logic integrated within the semiconductor die 420 or elsewhere, or using a microcontroller configured to operate as described below, or any other form of processor suitably configured to operate as described below. Likewise, the turn-on pre-driver 420 and turn-off pre-driver 422 may be implemented in any suitable way known to the skilled person, for example as buffers and/or digital buffers and/or amplifiers.

The first driver 130 is coupled to a power supply/source PVDD and PVSS, which may be a relatively low current power supply (for example, the first driver circuit 130 may draw less than 50 mA, or less than 30 mA, such as a typical average current of less than 20 mA, from the power supply). When the first driver 130 is in the charging state, the FET 440 is switched off (i.e., the first switch 134 is open), such that the current flowing through the VCSEL 110 is 0 A, or substantially 0 A (i.e., sufficiently low that there is no risk of the VCSEL 110 emitting any light). The power supply may be any suitable power supply to which the first driver 130 may be coupled. For example, if the light source system 100 is included as part of a larger device/system (such as a mobile device), the power supply may be the power supply of that larger device system (such as the battery of the mobile device). During the charging state, the first capacitor 130 is gradually charged by the power supply.

When a light pulse emission is desired, the first driver 130 may be transitioned from the charging state to the emission state. To control this transition, the controller 430 may use control lines 434 and/or 436 to control operation of the FET 440. For example, the controller 430 may receive an instruction via its input line 432 (which may take any suitable form, for example it may be an LVDS differential signal) to start a light pulse emission from the VCSEL 110. The controller 430 may then drive the control line 434 so that the turn-on pre-driver 420 applies a turn-on signal to the gate of the FET 440 in order to turn on the FET 440 (i.e., close the first switch 134). In this example, the turn-on signal is a voltage signal that exceeds the turn-on threshold voltage of the FET 440. The turn-on pre-driver 420 is used in this example because the first drive current 136 that will flow through the FET 440 when it is turned on should be relatively large (for example, between about 5 A and 12 A, such as >8 A, or >10 A), so the FET 440 should be a relatively high power FET 440. Most controllers may not be capable of supplying a sufficiently large drive signal to the FET 440 to turn it on, or at least may not be capable of supplying a sufficiently large drive signal to turn the FET 440 on quickly enough to achieve a quick transition from off to on. Therefore, the turn-on pre-driver 420 effectively functions to increase the signal set by the controller 430 on the control line 434 to a level sufficient to drive the FET 440 to turn on quickly.

In this arrangement, the power drawn by the turn-on pre-driver 420 and turn-off pre-driver 422 is supplied by the voltage regulator 410, which in turn draws the majority, if not all, of its power from the capacitor 132 discharging. By arranging it in this way, most, if not all, of the current required to switch the first driver 130 between the charging and emission states is kept within the first driver 130 and is not drawn from elsewhere, such as the power supply PVDD and PVSS. Some of the benefits of drawing the majority, if not all, required energy from the capacitor 132, rather than external sources, is explained earlier with reference to the first drive current 136. Furthermore, if the voltage regulator 410 and the pre-drivers are also integrated into the die 120, they may all be relatively close to each other and to the capacitor 132, further increasing switching speed and reducing losses.

When the FET 440 is turned on (i.e., the first switch 134 is closed), the first driver 130 is in the emission state and the first drive current circuit is closed such that the first drive current 136 flows between the VCSEL 110.

It can be seen that in this example arrangement of the first driver 130, the first capacitor 132 is coupled between an anode terminal of the VCSEL 110 and a reference voltage (ground in this example, but the reference voltage could alternatively be any other suitable voltage level) of the first driver 130 (i.e., one terminal of the capacitor 132 is coupled to the VCSEL 110 and the other terminal of the capacitor 132 is coupled to the reference voltage). Whilst this particular configuration is not essential, it has a benefit that the VCSEL 110 can be driven by positive voltages within the first driver 130, such that driving the VCSEL 110 does not require the generation of negative voltages within the first driver 130. This may be beneficial to simplify operation of the first diver 130 and enables the components of the first diver 130 to be integrated in the semiconductor die 120 using, for example junction isolation, and not require dielectric isolation.

Figure 5:
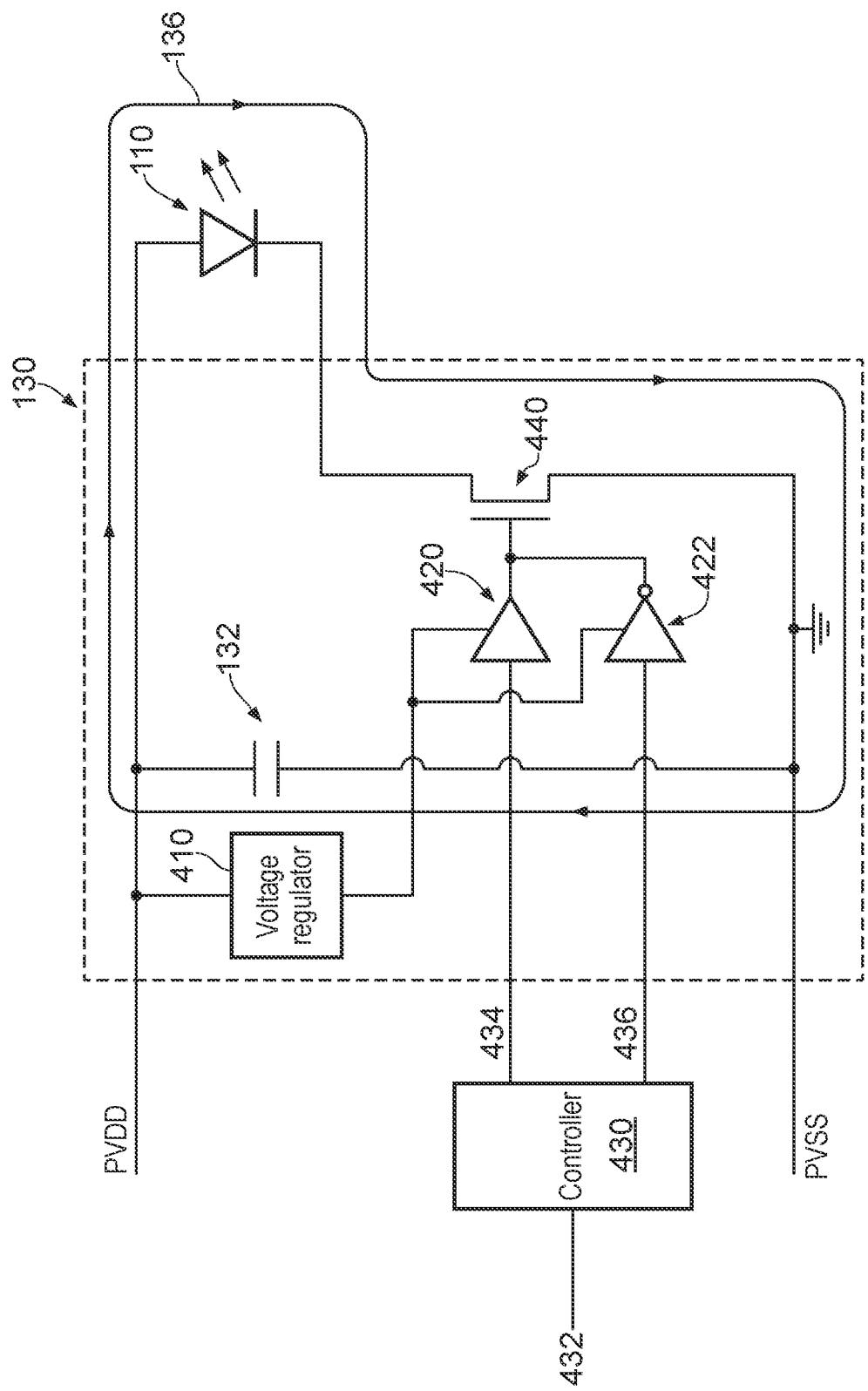
FIG. 5 shows an example representation of the first drive current generated by the first driver represented in FIG. 4.

FIG. 5 shows an example representation of first drive current 136 flowing through the first drive current circuit. During the emission state, the first capacitor 132 discharges to generate the first drive current 136. Consequently, the majority, if not all, of the energy required for the first drive current 136 is supplied by the first capacitor 132 during the drive time, such that the draw on the power supply PVDD and PVSS is very low (for example <5%, or <1%, of the first driver current 136 may be drawn from the power supply), if not effectively zero. As such, the majority, if not all, of the first drive current 136 is kept within the first driver 130 (i.e., no current, or no significant current, is drawn from sources elsewhere), within a relatively small first drive current circuit. In one alternative implementation, a further switch may be used to isolate the first driver 130 from the power supply when the first diver 130 is in the emission state, although in most implementations this should not be necessary since the first capacitor 130 provides so much energy during the emission state that the draw on the power supply is insignificant.

By utilising the first capacitor 132 in this way, the first capacitor 132 may be gradually, slowly charged by the power supply during the charging state, which should not affect the power supply in any significant way. The first capacitor 132 may then discharge to generate the first drive current 136 such that the power supply may be effectively, or entirely, unaffected by the relatively high first drive current 136. Consequently, it may be possible for the power supply to be of a standard specification, thereby minimising costs, and may be used by other components/systems without being affected by the light source system 100. Furthermore, because the first drive current 136 is generated effectively entirely by the integrated first capacitor 132 acting as a source of power, the first current driver circuit is kept relatively small (compared with the case where the first drive current 136 is drawn from an external power supply), which reduces delays in the first drive current 136 commencing and increases the speed of operation.

During the emission state, the first driver 130 may be configured such that the first capacitor 132 may be completely, or only partially, discharged in the process of generating the first drive current 136. In some implementations, generating the first drive current 136 may result in only a partial discharge of the charge stored on the first capacitor 132, such that the voltage across the first capacitor 132 is reduced (for example, by a few volts), but there is still a non-zero voltage across the first capacitor 132 at the end of the emission state. In this case, the voltage across the capacitor 132 may be monitored before, during and/or after the emission state, such that the amount of first drive current 136 supplied to the VCSEL 110 during the emission state may be determined. The size of the first capacitor 132 may be set to any suitable value depending on the amount of voltage headroom desired (i.e., the desired voltage across the capacitor at the end of the emission state) and/or the voltage of the power supply PVSS and PVDD and/or the desired first drive current level and/or the duration of the first drive current and/or the duty ratio of emission state to charging state. By way of non-limiting example, if a first drive current 136 of about 10 A is desired, for a first drive current duration of about 300 ps, with a desired reduction of voltage across the first capacitor 132 during the emission state of about 3V, the first capacitor 132 may have a capacitance of about 3 nF.

Furthermore, because the capacitor 132 can store only a finite amount of energy, if there is a fault or failure in the system, the relatively high first driver current 136 can only be sustained for a finite, relatively short, period of time. Consequently, the light source system 100 may have improved safety, compared with other devices that draw drive current from a less limited supply.

In order to transition the first driver 130 from the emission state to the charging state, the FET 440 is turned off (i.e., the switch 134 is opened), thereby opening the first drive current circuit and stopping the first drive current 136 from flowing through the VCSEL 110. To control this transition, the controller 430 may use control lines 434 and/or 436 to control operation of the FET 440. For example, the controller 430 may receive an instruction via its input line 432 to stop a light pulse emission from the VCSEL 110. The controller 430 may then set control line 434 to a level that will turn off the FET 440, for example to a voltage that is below the turn-on threshold voltage of the FET 440. The controller 430 may also apply a turn-off signal to the gate of the FET 440 using the turn-off pre-driver 422, which may be designed to have a very high drive strength and speed in one direction (i.e., pulling down the gate of the FET 440). For example, because in this implementation the turn-off pre-driver 422 is an inverting type pre-driver, the controller 430 may set the voltage at control line 436 to a 'high' voltage (e.g., 3.3V, or 5V), resulting in the output of the turn-off pre-driver 422 going 'low' (e.g., to 0V). Using the turn-off pre-driver 422 in this way, the speed with which the relatively high current FET 440 may switch off may be improved. The inventors have recognised that whilst this control of the turn-on pre-driver 420 and the turn-off pre-driver 422 may take place at the same time and a relatively fast turn off speed be achieved for the FET 440, an even faster turn-off speed may be achieved by applying the turn-off signal to the gate of the FET 440 first (such that both the turn-on signal and turn-off signal are applied to the gate of the FET 440 for a first period of time) and then subsequently removing the turn-on signal such that then only the turn-off signal is applied to the gate terminal of the FET 440 for a second period of time. This effect may be particularly realised when the turn-off pre-driver 422 is designed to have a relatively high drive strength compared with the drive strength of the turn-on pre driver 420, which results in the turn-off pre-driver 422 overdriving the turn-on pre-driver 420. The superior drive strength of the turn-off pre-driver 422 may thus result in pulling down the gate of the FET 440 faster than could otherwise be achieved. It may be counter intuitive to drive the gate of the FET 440 with both the turn-on and turn-off signal for a first period of time in order to turn off the FET 440, but the inventors have nevertheless realised that such driving may increase the turn off speed of the FET 440.

It will be appreciated that each of the turn-on pre-driver 420 and the turn-off pre-driver 422 may be inverting or non-inverting type and the signals applied by the controller 430 to the control lines 434 and 436 set accordingly. Furthermore, it will be appreciated that the turn-off pre-driver 422 is optional and in an alternative it may be omitted entirety, with the FET 440 being turned off merely by changing the voltage applied to its gate so that it is below the turn-on threshold of the FET 440.

Figure 6:
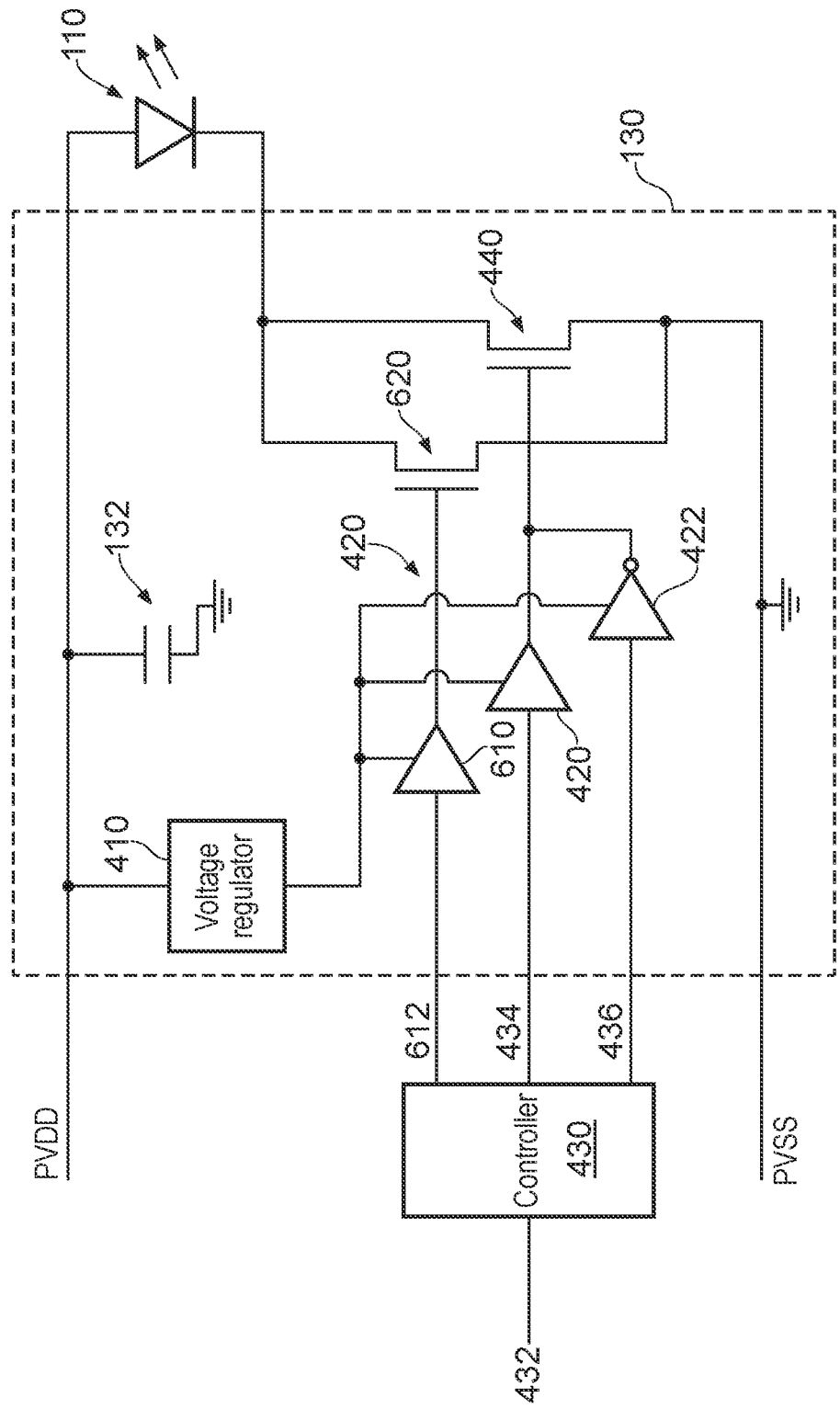
FIG. 6 shows a schematic representation of details of a further example implementation of the light source system of FIG. 1.

FIG. 6 shows an example alternative implementation of the first driver 130. This implementation is similar to that represented in FIGS. 4 and 5, but includes an additional turn-on pre-driver driver 610, an additional control line 612 from the controller 430 and an additional FET 620. The FET 620 is a relatively low current FET (for example, rated at around 400 mA, compared with about 10 A for the FET 440) and acts as a VCSEL pre-bias, to enable a relatively low, sub-lasing threshold, current to flow through the VCSEL 110 before the VCSEL 110 is fully turned on by the FET 440. As such, prior to desiring the turn-on of the VCSEL 110, the controller 612 may apply a turn-on voltage to the gate of the additional FET 620 (i.e., a voltage exceeding the turn-on threshold voltage of the additional FET 620) using the additional turn-on pre-driver 620. Once the additional FET 620 is turned on, a relatively low current may flow through the additional FET 620 (for example, about 400 mA). Because the current is relatively low, and below the lasing threshold of the VCSEL 110, the VCSEL 110 will not yet start emitting light. However, ideally, the current level will be only just below the lasing-threshold. When the VCSEL 110 is to be turned on, the FET 440 may be turned on as described above so that the relatively high first drive current 136 may flow through the first drive current circuit and turn on the VCSEL 110. The additional FET 620 may then be turned off by the controller 430 by reducing the gate voltage at the additional FET 620, for example once the FET 440 is fully turned on. It will be appreciated that using the additional FET 620 in this way may speed up the time between the controller 430 starting to turn on the FET 440 and light being emitted from the VCSEL 110, since the VCSEL 110 will already be close to lasing at the time the FET 440 starts to switch on.

Figure 7:
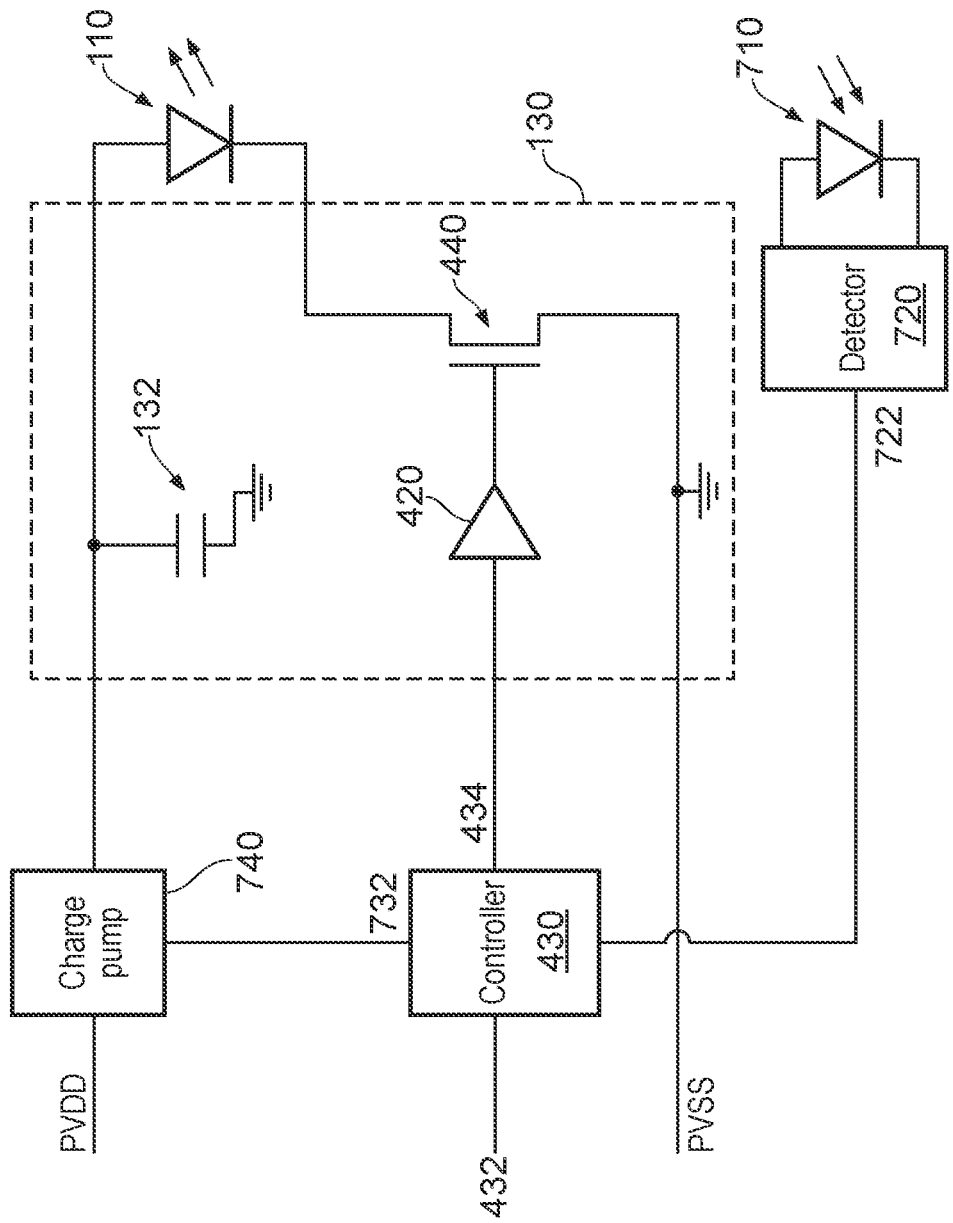
FIG. 7 shows a schematic representation of details of a further example implementation of the light source system of FIG. 1.

FIG. 7 shows an example of a further alternative implementation of aspects of the light source system 110. This implementation shows a simplified implementation of the first driver 130 that includes just the first capacitor 132, the turn-on pre-driver 420 and the FET 440. However, it will be appreciated that the first driver 130 may alternatively be implemented in the ways represented in FIG. 4, 5 or 6.

In this implementation, a photodetector 710 is configured to receive light emitted from the VCSEL 110. For example, the photodetector 710 may be the photodetector used for ToF imaging and may receive some stray light emitted from the VCSEL 110 and reflected directly back to the photodiode by device optics packaging, such that it detects light emitted from the VCSEL 110 (and not just light reflected from the object being imaged). Alternatively, it may be arranged in such a way as to directly receive light emitted from the VCSEL 110. The photodetector 710 is coupled to a detector 720, which is configured to output a signal 722 indicative of whether or not the photodetector 710 has received light output from the VCSEL 110. The controller 430 may then be configured to control the operation of a charge pump 740 based on the received signal 722. In particular, if the controller 430 transitions the first driver 130 to the emission state and subsequently receives a signal from the detector 720 indicating that the photodetector 710 received light output from the VCSEL 110, the controller 430 may then enable the charge pump 740 using control line 732. In this instance, the light source system can be assumed to be working correctly and the charge pump 740 will then be operable to charge the first capacitor 132 when the first driver 130 is next in the charging state. If, however, the detector 720 does not output a signal 722 indicative of the photodetector 710 having received light output from the VCSEL 110, the controller 430 may disable the charge pump 740 using control line 732. The charge pump 740 may then not charge the first capacitor 132 when the first driver 130 is next in the charging state, such that no further energy will be stored by the first capacitor 132 for use in trying to drive the VCSEL 110. In this instance, the photodetector 710 may not have received any light emitted from the VCSEL 110 because there may be some error or failure in the light source system that is preventing the VCSEL 110 from emitting light properly. Since the light source system may be used in safety critical ToF applications, or the fault may be of a type that would be electrically dangerous to the light source system and/or a nearby system and/or an operator, preventing further capacitor charging and attempted emissions from the VCSEL 110 may improve the overall safety of the light source system. Optionally, the controller 430 may be configured to output a failure warning to any other suitable systems/entities.

Whilst a charge-pump 740 is used in this particular example, any other suitable circuit/component may be used to control connection/disconnection of the first driver 130 to the power supply based on detection of light emitted from the VCSEL 110. For example, the charge pump 740 could be replaced with a switch (such as a transistor) controlled by the controller 430 to connect or disconnect the first driver 130 from the power supply PVDD. In a further alternative, rather than using a charge pump 740, the power supply could be a controllable power supply, such as a switch mode power supply, which may be controlled by the controller 430 to provide power, or not, to the first driver 130.

Whilst FIGS. 4 to 7, and the above explanations, relate only to the first driver 130, it will be appreciated that the second driver 140 may be implemented in exactly the same ways. The light source system 100 may have a single controller 430 that is configured to control the operation of the first driver 130 and the second driver 140 such that they each generate the first drive current 136 and the second drive current 146 at substantially the same time, or each of the first driver 130 and second driver 140 may have their own controller that operates as described above. Likewise, each of the first driver 130 and the second driver 140 may have a respective voltage regulator, or a single voltage regulator may be used to power the pre-drivers in both the first driver 130 and the second driver 140.

The skilled person will readily appreciate that various alterations or modifications may be made to the above described aspects of the disclosure without departing from the scope of the disclosure.

For example, whilst the above example first driver 130 includes one or more pre-drivers 420, 422, etc, in an alternative, the pre-drivers may be omitted entirely and the FET 440 (and optionally also additional FET 620) may be driven directly by the controller 430. In this alternative, the voltage regulator 410 may be omitted entirely. Furthermore, even when the first driver 130 includes one or more pre-drivers, whilst it may be beneficial to power the pre-drivers using the voltage regulator 410, at least one of the one or more pre-drivers may alternatively be powered in any other suitable way and the voltage regulator omitted from the first driver 130.

Whilst in the above examples, FETs are used (for example, FET 440 and additional FET 620), any other suitable type of controllable switch may alternatively be used, for example any other type of transistor, such as BJTs, etc. Therefore, whenever the gate of a FET is referred to, this should be understood to be the gate/base of a transistor.

In the above disclosure, two drivers (the first driver 130 and the second driver 140) are described. Using two drivers may be particularly beneficial for the VCSEL 110 design represented in FIGS. 1, 2A and 2B, where there are two anode terminals on the surface of the VCSEL 110, so that the two drivers may be arranged symmetrically within the die 120. However, in an alternative, only a single driver (for example, only the first driver 130) may be implemented to provide all of the drive current required to drive the VCSEL 110. For example, the VCSEL 110 may be of a design where there is only one anode terminal. Alternatively, the VCSEL 110 may be of a design where there are two or more anode terminals, in which case the single driver may be coupled to any one or more of the anode terminals.

In a further alternative, the die 120 may comprise more than two integrated drivers arranged to drive the VCSEL 110. For example, it may comprise four drivers, each of the same design as the first driver 130 described above. These plurality of drivers may be arranged in any suitable way within the die 110, for example first and second drivers may be symmetrical to each other with reference to a first plane of symmetry, and the third and fourth drivers may be symmetrical to each other with reference to a second plane of symmetry that is perpendicular to the first plane of symmetry.

Whilst the above light source system 110 is described particularly with reference to use with ToF camera systems, the light source system 110 is not limited to this use and may be used for any other purpose.

The terms 'coupling' and 'coupled' are used throughout the present disclosure to encompass both direct electrical connections between two components/devices, and also indirect electrical coupling between two components/devices where there are one or more intermediate components/devices in the electrical coupling path between the two components/devices.

Whilst the first driver 130 is described as having a switch 134 for use in controlling the transition or switching between the charging state and emission state, it will be appreciated that the first driver 130 may be configured in any other suitable way, using any other suitable components to switch or transition the first driver 130 between a charging state, where the first capacitor 132 gradually stores charge received from a power supply and the VCSEL 110 is turned off, and an emission state where the first capacitor 132 discharges to generate the first drive current 136 to turn on the VCSEL 110. Likewise, it is not essential that a controller 430 is used to control the switching or transition of the first driver 130 between the charging state and the emission state. Any other suitable arrangement or circuit could alternatively be used for that purpose, for example a timer circuit configured to transition the first driver 130 at regular intervals, or a circuit configured to transition the first driver 130 based on the amount of charge stored on the first capacitor 132 (for example, switching to the emission state when the charge stored on the first capacitor 132 reaches a predetermined level), etc.

The invention claimed is:

1. A circuit for coupling to a light source for controlling emission of light from the light source, the circuit comprising:
   a transistor for controlling a drive current such that when the transistor is in a first state, the drive current is supplied to the light source to turn the light source on and when the transistor is in a second state, the drive current is not supplied to the light source;
   a turn-on pre-driver coupled to a base/gate of the transistor, wherein the turn-on pre-driver is configured to receive a turn-on control signal and output a corresponding turn-on signal to the base/gate of the transistor in order to turn on the transistor; and
   a turn-off pre-driver coupled to the base/gate of the transistor, wherein the turn-off pre-driver is configured to receive a turn-off control signal and output a corresponding turn-off signal to the base/gate of the transistor in order to turn off the transistor and
wherein the turn-on pre-driver is configured to receive the turn-on control signal for a first period of time and the turn-off pre-driver is configured to receive the turn-off control signal for a second period of time, such that both the turn-on signal and the turn-off signal are applied to the base/gate of the transistor for the first period of time, and then only the turn-off signal is applied to the base/gate of the transistor for the second period of time.

2. The circuit of claim 1, further comprising a controller configured to output the turn-on control signal and the turn-off control signal, wherein to turn off the transistor the controller is configured to:
output the turn-on control signal for the first period of time and output the second control signal for the second period of time, such that during the first period of time both the turn-on control signal are simultaneously output and both the turn-on signal and the turn-off signal are applied to the base/gate of the transistor, and for the second period of time only the turn-off control signal is output such that only the turn-off signal is applied to the base/gate of the transistor for the second period of time.

3. The circuit of claim 1, further comprising a capacitor for storing electrical energy for use in generating the drive current, wherein the circuit is configured to operate in:
a charging state when the transistor is in the second state, during which the capacitor stores charge received from a power supply; and
an emission state when the transistor is in the first state, during which the capacitor discharges to generate the drive current, which is supplied to the light source to turn the light source on.

4. The circuit of claim 3, wherein the first transistor is for coupling between a cathode terminal of the light source and a reference voltage, and
wherein the capacitor is for coupling between an anode terminal of the light source and the reference voltage.

5. A light source system comprising:
a light source; and
a semiconductor die comprising an integrated first driver, wherein the light source is mounted on a surface of the semiconductor die and the integrated first driver is coupled to the light source and configured to control supply of a first drive current to the light source for controlling operation of the light source, wherein the integrated first driver comprises an integrated first capacitor for storing electrical energy for use in generating the first drive current and an integrated first switch for controlling the supply of the first drive current to the light source, wherein the integrated first switch comprises a first transistor;
a turn-on pre-driver configured to receive a turn-on control signal and output to a gate/base terminal of the first transistor a corresponding turn-on signal in order to turn on the first transistor and turn on the light source; and
a voltage regulator coupled to the integrated first capacitor and the turn-on pre-driver, wherein the voltage regulator is configured to:
receive energy from the integrated first capacitor; and
supply a regulated voltage to the turn-on pre-driver at least during transition of the first transistor from an off state to an on state.

6. The light source system of claim 5, wherein the integrated first driver is configured to operate in:
a charging state, during which the integrated first capacitor stores charge received from a power supply; and
an emission state, during which the integrated first capacitor discharges to generate the first drive current, which is supplied to the light source to turn the light source on.

7. The light source system of claim 6, wherein the integrated first switch is configured to:
during the emission state, close a first drive current circuit comprising the integrated first capacitor and the light source to carry the first drive current between the light source and the integrated first driver; and
during the charging state, open the first drive current circuit during the charging state to stop the supply of first drive current to the light source.

8. The light source system of claim 7, wherein the integrated first switch is coupled between a cathode terminal of the light source and a reference voltage of the integrated first driver, and
wherein the integrated first capacitor is coupled between an anode terminal of the light source and the reference voltage of the integrated first driver.

9. The light source system of claim 5, wherein the integrated first switch comprises a first transistor.

10. The light source system of claim 9, further comprising:
a pre-driver configured to output a control signal to a gate/base terminal of the first transistor for controlling a switch state of the first transistor.

11. The light source system of claim 10, further comprising:
a turn-on pre-driver configured to receive a turn-on control signal and output to a gate/base terminal of the first transistor a corresponding turn-on signal in order to turn on the first transistor and turn on the light source.

12. The light source system of claim 11, further comprising a voltage regulator coupled to the integrated first capacitor and the turn-on pre-driver, wherein the voltage regulator is configured to:
receive energy from the integrated first capacitor; and
supply a regulated voltage to the turn-on pre-driver at least during transition of the first transistor from an off state to an on state.

13. The light source system of claim 9, further comprising:
a turn-off pre-driver configured to receive a turn off control signal and output to a gate/base terminal of the first transistor a corresponding turn-off signal in order to turn off the first transistor and turn off the light source.

14. The light source system of claim 5, wherein the light source comprises a first terminal of a first polarity having at least one bonding contact on a first surface of the light source and a second terminal of a second polarity having at least one bonding contact on a second surface of the light source, and
wherein the integrated first driver is connected to the at least one bonding contact of the first terminal and to the at least one bonding contact of the second terminal such that the first drive current can flow through the light source to turn on the light source.

15. The light source system of claim 14, wherein the first surface of the light source is affixed to a first surface of the semiconductor die, and wherein the first integrated driver is coupled to the at least one bonding contact of the second terminal by at least one bonding wire.

16. A light source system comprising:
a light source; and
a semiconductor die comprising an integrated first driver, wherein the light source is mounted on a surface of the semiconductor die and the integrated first driver is coupled to the light source and configured to control supply of a first drive current to the light source for controlling operation of the light source,
wherein the integrated first driver comprises an integrated first switch for controlling the supply of the first drive current to the light source; and
wherein the light source comprises:
a first terminal of a first polarity having a first bonding contact on a first surface of the light source; and
a second terminal of a second polarity having a second bonding contact and a third bonding contact on a second surface of the light source,
wherein the first driver is coupled to the first bonding contact and the second bonding contact such that the first drive current can flow between the second terminal and the first terminal to turn on the light source, and
wherein the semiconductor die further comprises an integrated second driver coupled to the first bonding contact and the third bonding contact, wherein the second driver is configured to control supply of a second drive current to the light source such that the second drive current can flow between the second terminal and the first terminal to turn on the light source.

17. The light source system of claim 16, wherein the second bonding contact and the third bonding contact are both arranged on the second surface of the light source such that they are substantially symmetrical about a plane of symmetry, and
wherein the first integrated driver and the second integrated driver are arranged within the semiconductor die such that they are substantially symmetrical about the plane of symmetry.

18. A light source control system for driving a light source, the light source control system comprising:
a driver for coupling to the light source, the driver comprising:
at least one capacitor for storing charge; and
a controllable switch for switching the driver between a charging state and an emission state, wherein during the emission state the at least one capacitor discharges to supply a drive current to the light source to turn the light source on;
a photodetector arranged to detect light emitted from the light source; and
a controller coupled to the driver and the photodetector, wherein the controller is configured to control the driver such that during the charge state the at least one capacitor stores charge only if the photodetector detected light emitted from the light source during a preceding emission state.

19. The light source control system of claim 18, wherein the driver further comprises a charge pump, wherein the controller is configured to:
enable the charge pump when the photodetector detected light emitted from the light source during the preceding emission state so that the charge pump supplies charge to the capacitor during the charging state; and
disable the charge pump when the photodetector did not detect light emitted from the light source during the preceding emission state so that the charge pump does not supply charge to the capacitor during the charging state.

20. The light source control system of claim 18, wherein the driver further comprises a power switch for switchably coupling and decoupling the driver from a power supply, wherein the controller is configured to:
control the power switch to couple the capacitor to the power supply when the photodetector detected light emitted from the light source during the preceding emission state so that charge is supplied to the capacitor by the power supply during the charging state; and
control the power switch to decouple the capacitor from the power supply when the photodetector did not detect light emitted from the light source during the preceding emission state so that charge is not supplied to the capacitor by the power supply during the charging state.

21. A circuit for coupling to a light source for controlling emission of light from the light source, the circuit comprising:
a transistor for controlling a drive current such that when the transistor is in a first state, the drive current is supplied to the light source to turn the light source on and when the transistor is in a second state, the drive current is not supplied to the light source;
a first turn-on pre-driver coupled to a base/gate of the transistor, wherein the turn-on pre-driver is configured to receive a first turn-on control signal and output a corresponding first turn-on signal to the base/gate of the transistor in order to turn on the transistor; and
a separate second turn-off pre-driver coupled to the base/gate of the transistor, wherein the turn-off pre-driver is configured to receive a second turn-off control signal and output a corresponding second turn-off signal to the base/gate of the transistor in order to turn off the transistor, wherein the first turn-on control signal is a separate and independent signal from the second turn-off control signal.

* * * * *